United States Patent [19]
Cunningham et al.

[11] Patent Number: 5,589,404
[45] Date of Patent: Dec. 31, 1996

[54] MONOLITHICALLY INTEGRATED VLSI OPTOELECTRONIC CIRCUITS AND A METHOD OF FABRICATING THE SAME

[75] Inventors: John E. Cunningham, Lincroft; Keith W. Goossen, Aberdeen; William Y. Jan, Scotch Plains; Rajiv N. Pathak, Matawan; James A. Walker, Howell, all of N.J.

[73] Assignee: Lucent Technologies Inc., Murray Hill, N.J.

[21] Appl. No.: 284,026

[22] Filed: Aug. 1, 1994

[51] Int. Cl.⁶ ............................................. H01L 31/18
[52] U.S. Cl. ..................... 437/5; 437/3; 437/4; 437/53; 437/107; 437/133
[58] Field of Search .................... 437/2, 3, 4, 5, 437/209, 220, 221, 224, 946; 257/444, 290, 291, 292, 84, 83; 457/53, 133, 107

[56] References Cited

U.S. PATENT DOCUMENTS

| | | | |
|---|---|---|---|
| 4,862,237 | 8/1989 | Morozumi | 257/444 |
| 4,996,163 | 2/1991 | Sasaki | 437/5 |
| 5,179,029 | 1/1993 | Gottscho et al. | 437/10 |
| 5,242,839 | 9/1993 | Oh et al. | 437/5 |
| 5,273,920 | 12/1993 | Kwasnick et al. | 437/5 |
| 5,275,687 | 1/1994 | Choquette et al. | 437/946 |
| 5,302,545 | 4/1994 | Okada et al. | 437/53 |
| 5,314,836 | 5/1994 | Lavine | 437/53 |
| 5,322,811 | 6/1994 | Komuro et al. | 437/4 |
| 5,357,121 | 10/1994 | Miyashita et al. | 257/84 |
| 5,371,038 | 12/1994 | Tsui | 437/133 |
| 5,379,719 | 1/1995 | Chalmers et al. | 437/133 |
| 5,384,267 | 1/1995 | Hutching et al. | 437/5 |

FOREIGN PATENT DOCUMENTS

| 164044 | 6/1989 | Japan | 437/224 |
|---|---|---|---|

OTHER PUBLICATIONS

C. E. C. Wood et al., Improved Molecular–Beam Epitaxial GaAs Power FET's, J. Appl. Phys. 51(4), Apr. 1980, pp. 2074–2078.

K. D. Choquette et al., GaAs Surface Reconstruction Obtained Using A Dry Process, J. Appl. Phys. 73(4), Feb. 15, 1993, pp. 2035–2037.

M. Hong et al., Removal Of GaAs Surface Contaminants Using $H_2$ Electron Cyclotron Resonance Plasma Treatment Followed by $Cl_2$ Chemical Etching, Appl. Phys. Lett. 62(21), May 24, 1993, pp. 2658–2660.

K. V. Shenoy et al., Optoelectronic VLSI Circuit Fabrication, IEEE Lasers and Electro–Optics Society, Conference Proceedings, Nov., 1993, pp. 433–434.

*Primary Examiner*—Kevin M. Picardat

[57] ABSTRACT

A monolithically integrated, optoelectronic VLSI circuit is fabricated by growing optical devices on the compound semiconductor surface of a VLSI chip or wafer having pre-existing electronic devices formed thereon. In accordance with an illustrative embodiment of the present invention, a large array of surface normal optical modulating devices such as multiple quantum well modulators is grown on an impurity free surface of a VLSI chip having an array of FETs already provided thereon. The growth of such devices takes place at temperatures below 430° C. on a compound semiconductor surface which has a highly ordered atomic structure. An optoelectronic switch constructed in this manner is capable of addressing electronic chips in systems handling 10,000 or more input/output optical beams.

15 Claims, 4 Drawing Sheets

MONOLITHICALLY INTEGRATED VLSI OPTOELECTRONIC CIRCUITS AND A METHOD OF FABRICATING THE SAME

FIELD OF THE INVENTION

The present invention relates generally to monolithically integrated circuit devices and, more particularly, to metallized VLSI circuits having monolithically integrated optical interconnects formed thereon and to a process for fabricating the same.

BACKGROUND OF THE INVENTION

Surface normal modulating devices capable of high speed, optical information processing within massively parallel architectures are currently sought for use in a wide variety of communication systems. Such integration would be particularly advantageous in so-called smart pixels applications, where optical interconnects may be clocked at speeds beyond several Gbits/second. Surface normal modulating devices such as Multiple Quantum Well modulators (MQW's), for example, may be fabricated into large arrays capable of addressing electronic chips in systems handling 10,000 or more input/output optical beams. It is expected that the use of inter-chip optical interconnects within a high density digital processor operating above a few GHz will reduce skew in clock signal distribution as well as timing errors.

Investigation has revealed that the ohmic contact of FETs and related devices suffers significant deterioration at temperatures above 430° C. Several issues, therefore, must be addressed in order to successfully integrate optical devices, such as MQW modulators, onto an IC already having metallized VLSI electronic devices. The GaAs surface of the metallized IC must be substantially impurity free to facilitate subsequent growth of optical components thereon. In addition to the native oxides typically present on GaAs surfaces, the major contaminants resulting from prior device processing and exposure to air include carbon, oxygen, and silicon. The well established technique for removing native oxides uses wet chemical etching followed by thermal desorption. Unfortunately, this technique does not provide the degree of surface purity and atomic ordering required for quantum well formation at low temperature.

Once a surface of sufficient purity has been obtained, regrowth must proceed at a temperature below 430° C. to avoid any degradation in the operating characteristics of the existing VLSI devices. Unfortunately, MBE regrowth temperatures well above 430° C. have heretofore been required in order to optimize quantum well formation.

K. V. Shennoy et al. have reported the integration of Light Emitting Diodes (LEDs) on GaAs with completely metallized VLSI FETs. OSA Proceedings, p. 9433 (1993, San Diego). The fabrication technique disclosed by Shennoy et al employs an MBE (Molecular Beam Epitaxy) regrowth of the LEDs on a fully metallized GaAs IC, as supplied by Vitesse Semiconductor. Only a few of the FETs, however, are expected to survive the MBE regrowth, which requires an annealing temperature in excess of 530° C. By contrast, modulator integration requires that a high density of VLSI FETs survive the MBE regrowth—as many as $10^5$/chip may be required—the Shennoy et al. technique cannot be successfully employed.

SUMMARY OF THE INVENTION

In accordance with the present invention, optical devices are grown on a compound semiconductor surface of a VLSI circuit having pre-existing electronic devices formed thereon to obtain monolithically integrated optoelectronic circuits. As such, a wide variety of novel structures, which could not be achieved with conventional thermal desorption and epitaxial growth techniques, may now be fabricated.

The material comprising the compound semiconductor surface will, of course, depend upon the type and desired performance characteristics of the electrical and optical devices to be formed thereon and interconnected. Illustratively, the compound semiconductor surface may be selected from the group consisting of Group III–V compounds, such as GaAs, AlGaAs, and so on.

In accordance with an illustrative embodiment of the present invention, the prefabricated electronic devices are field effect transistors and the optical devices are optical modulators. However, it is contemplated that monolithically integrated VLSI circuits employing diverse combinations of electronic and optical devices may also be fabricated using the teachings of the present invention. By way of example, other types of optical devices, such as lasers and photodetectors, may also be grown on the compound semiconductor surface of a VLSI circuit.

A process for fabricating VLSI optoelectronic circuits comprises the steps of removing surface contaminants from a compound semiconductor surface having a plurality of metallized electronic devices distributed over a portion thereof, and growing a plurality of optical devices on the compound semiconductor surface at a temperature below 500° C. The removing step comprises thermally activating the compound semiconductor surface while directing an atomic gas plasma at the surface. Preferably, the plasma is hydrogen plasma, which may be directed at the compound semiconductor surface with an electron cyclotron resonance source.

In order to avoid damage to the pre-existing electronic devices of an integrated circuit to which optical devices are to be connected in accordance with the present invention, the compound semiconductor surface is preferably kept at or below 430° C. during the removal step. For the same reason, the compound semiconductor surface is also preferably kept at or below 430° C. while the optical devices are being grown thereon. Because of the high degree of cleanliness achieved by the removal step, optical devices, as for example multiple quantum well optical modulators, may be formed by gas source molecular beam epitaxy even where the preferred 430° C. temperature limit is observed. After the optical devices are grown on the compound semiconductor surface, electrical interconnects are established between respective electronic devices and corresponding optical devices using a conventional metallization technique.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
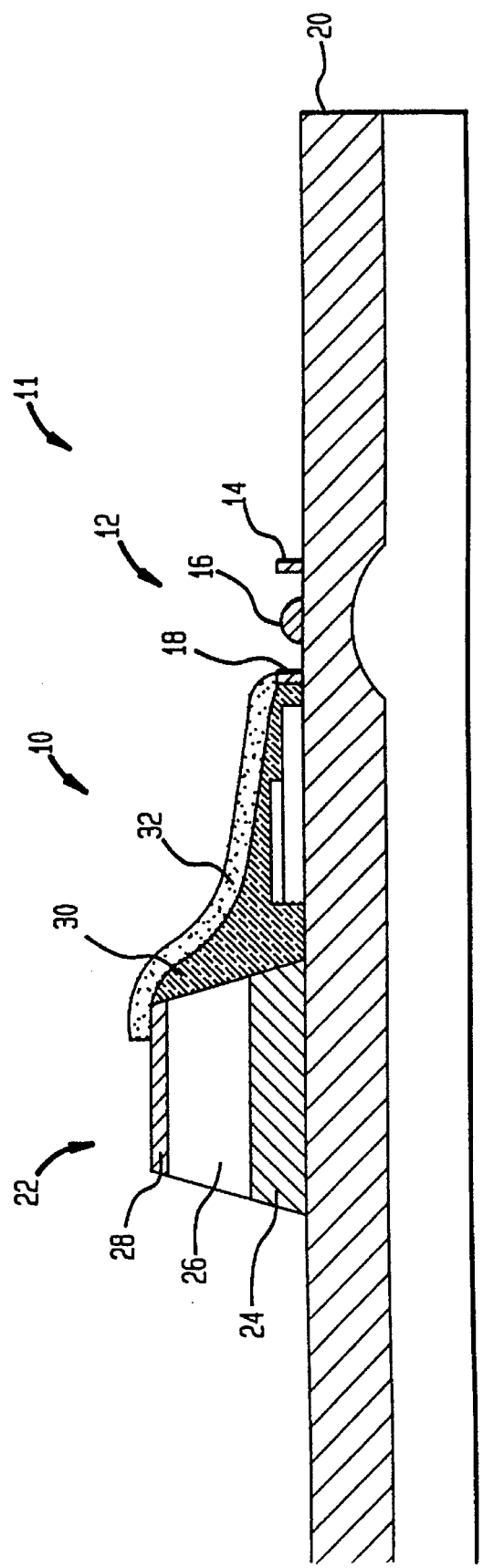
FIG. 1 is a cross sectional view of an IC device employing FETs and monolithically integrated optical modulators in accordance with an illustrative embodiment of the present invention.

With initial reference to FIG. 1, there is shown a single "smart pixel" 10 of a VLSI optoelectronic circuit 11 constructed in accordance with an illustrative embodiment of the present invention. An array of such elements may be employed, for example, in a high-density charge-coupled device (CCD) or high speed optical switch to address electronic chips in systems handling 10,000 or more input/output optical beams. As is well known to those skilled in this art, a smart pixel is an optical device having an electronic device electrically connected thereto. In the illustrative embodiment, each smart pixel 10 comprises a field effect transistor (FET) 12 having a source electrode 14, a gate electrode 16, and a drain electrode 18. The FETs are defined on a compound semiconductor surface layer 20 doped to a predetermined conductivity type. In this regard, it should be noted that the conductivity type and the dopant concentration, as well as the specific material comprising the surface layer 20, will depend upon the desired electrical and optical properties of the devices to be fabricated thereon. Thus, surface layer 20 may be formed of any desired combination of Group III-V semiconductor materials which has the appropriate or desired electrical properties and upon which the desired optical and electronic devices may be grown or otherwise formed.

In the illustrative embodiment of FIG. 1, layer 20 comprises an n-type implantation layer of GaAs on a (001) GaAs insulating substrate. As indicated previously, metallized VLSI chips having a dense array of electronic devices such as FETs fabricated on such a compound semiconductor surface are commercially available. A suitable chip having an array of over 10,000 FETs provided thereon, for example, is available from Vitesse Semiconductor of Camarillo, Calif. Heretofore, however, it has not been feasible to fabricate monolithically integrated smart pixel elements on such commercially available structures. As will soon be described in detail, however, each smart pixel 10 of optoelectronic circuit 11 is formed by growing an optical device 22 on surface layer 20 and providing an electrical connection to the drain electrode 18 of an associated FET 12.

In the illustrative embodiment, the optical device 22 is a multiple quantum well optical modulator having a Distributed Bragg Reflection (DBR) layer 24, a multiple quantum well layer 26, and a transparent cap layer 28. It is believed that the general construction and operating characteristics of such modulators are well known to those skilled in the art and for this reason, a detailed description of the same is deemed unnecessary and has been omitted from this description.

In any event, and as indicated previously, integration of devices such as light modulators onto a compound semiconductor surface cannot be achieved with conventional desorption and MBE regrowth techniques without severely impairing the operating performance of pre-existing devices such as FETs 12 of chip 11. Such conventional techniques would require an annealing temperature in excess of 530° C., and would cause substantial degradation of the ohmic contact resistance of the metallized, pre-existing electronic devices of chip 11. In accordance with the present invention, however, oxides, surface contaminants, and doping impurities are removed from the compound semiconductor surfaces of a device chip such as chip 11 with atomic hydrogen plasma via an Electron Cyclotron Resonance (ECR) source. During this process, an impurity-free surface having a highly ordered atomic structure is obtained. It is this surface structure, which exhibits multiple orders of Laue zone formation upon electron diffraction, that enables quantum well formation at MBE growth temperatures below 500° C. and specifically below 430° C. in accordance with the present invention. Such a high level of surface ordering, of course, is not required where temperatures of 530° C. and above can be tolerated, since growth will occur on "rougher", less ordered surfaces at such higher temperatures. At lower temperatures, however, there is no opportunity to "grow out" of surface roughness. As will now be described in detail, however, the inventive technique makes it possible to achieve the growth of optical devices on impurity free, compound semiconductor surfaces at temperatures below 400° C.

A device chip, such as chip 11, having metallized devices already formed thereon is first placed within an ECR plasma chamber (not shown). It is believed that those skilled in the art are familiar with the construction of ECR processing systems which may be utilized for ECR-assisted desorption in accordance with the present invention. For examples of systems which may be so utilized, reference may for example be had to several papers published by the Journal of Applied Physics including one paper by C. Wood (No. 51,2074, 1980), and several by K. D. Choquette et al. (Nos. 73,2035 and 62,2658, 1993). Where the compound semiconductor surface is GaAs, an $Al_2O_3$ cup is employed in the microwave cavity of the ECR source to avoid auto doping of the GaAs with Si (as would be the case if a SiO cup were used). Additionally, the ECR source is also preferably equipped with an acceleration grid to enhance the kinetic energy of protons striking the compound semiconductor surface.

The time required for ECR-assisted desorption depends upon the acceleration voltage and the temperature of the compound semiconductor surface. With GaAs, a voltage of 60 V, a surface temperature of 350° C., and a desorption time of 10 minutes have been found to produce satisfactory results. After cleansing of the GaAs surface, optical devices such as an MQW optical modulator are grown thereon. To fabricate such a modulator, a DBR layer 24 (FIG. 1) consisting of alternating layers (not shown) of low index AlAs and high index AlGaAs 50 is grown. Then, MQW layer 26, consisting of superlattices of 50 periods of 0.095 micron GaAs CW and 0.035 micron $Al_{0.3}Ga_{0.7}As$, for a total thickness of approximately 2 microns, is grown on the surface of DBR layer 24 by gas source MBE at 430° C. in a pin geometry. Finally, a transparent 0.5 micron cap layer 28 of p-type AlGaAs is grown on the surface of MQW 28.

To facilitate subsequent electrical interconnection of drain electrode 18 with cap layer 28 by metallization, a layer 30 of polyimide or other dielectric material is deposited therebetween to provide an even, gradually tapered path. A metal overlay 32 for interconnecting drain electrode 18 and cap layer 28 is patterned and deposited over polyimide layer 30, thereby resulting in the structure depicted in FIG. 1.

To evaluate the efficiency of ECR-assisted desorption, a sample of GaAs was placed within the ECR chamber which was operated to provide an $H_2$ flow of 3 cm³/min (SCCM) and microwave excitation of 180 watts forward, 1 watt reflected power. The total ion current emanating from the source was 10 mA at an acceleration voltage of 50–80 V. Higher acceleration leads to rough surfaces while lower voltages produce longer desorption times (up to an hour at 350° C.). For a voltage of 60 V, desorption requires 1, 10, and 60 minutes at substrate temperatures of 450° C., 350° C., and 200° C., respectively. These results suggest that the ECR assisted desorption process is thermally activated (similar to conventional desorption) but provides enhanced kinetics due to the plasma.

Figure 2B:
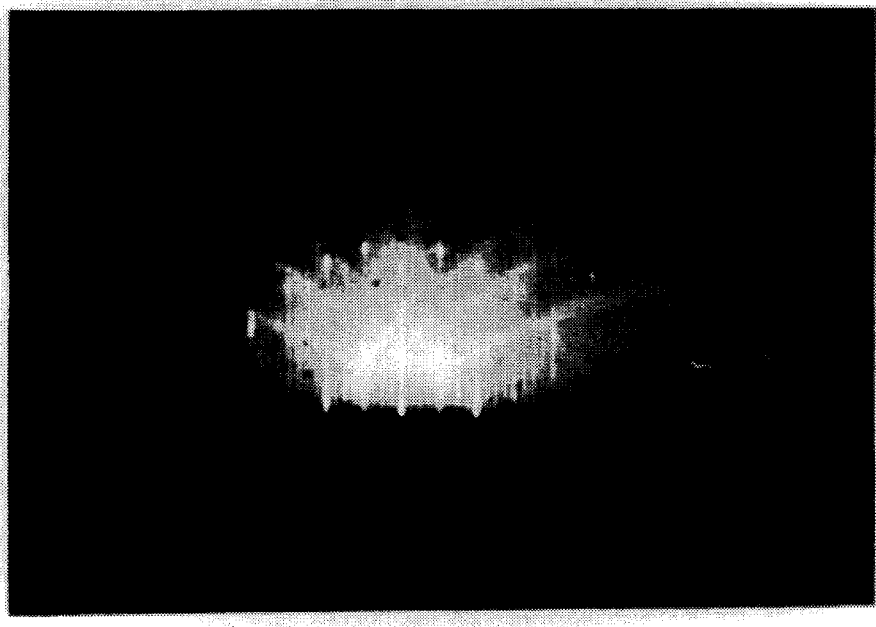
FIGS. 2A and 2B are RHEED diffraction patterns from GaAs at 350° C. after 1 and 10 minute exposure to the hydrogen plasma, respectively.
Figure 2A:
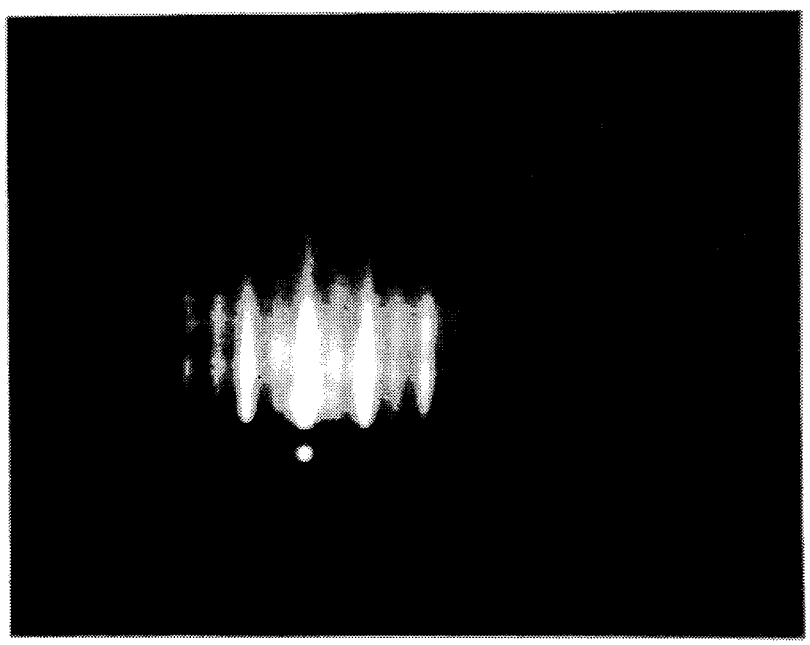

The desorption quality was evaluated with an in situ RHEED gun operating at 30 KeV so that surface ordering could be measured via higher order Laue zone formation. FIGS. 2A and 2B illustrate the results obtained from two ECR desorbed GaAs surfaces obtained respectively with 2 and 10 minute exposure to hydrogen protons under the above-described conditions. The two surfaces corresponded to the C 4×2 and C 4×4, which are the anion and cation rich surfaces of GaAs. Both surfaces exhibited remarkable diffraction structure as evidenced by the appearance of spots intersecting the 0th order Laue zone. Smaller intensity was diffracted into elongated streaks, thus indicating low surface disorder. The surfaces differed from the spotty, uneven surface character which often accompanies thermal desorption. The Garich surface showed the highest degree of surface ordering as indicated by the appearance of five distinct Laue zones. In situ auger spectroscopy carried out on these surfaces showed no evidence of impurities after the desorption process.

Figure 3:
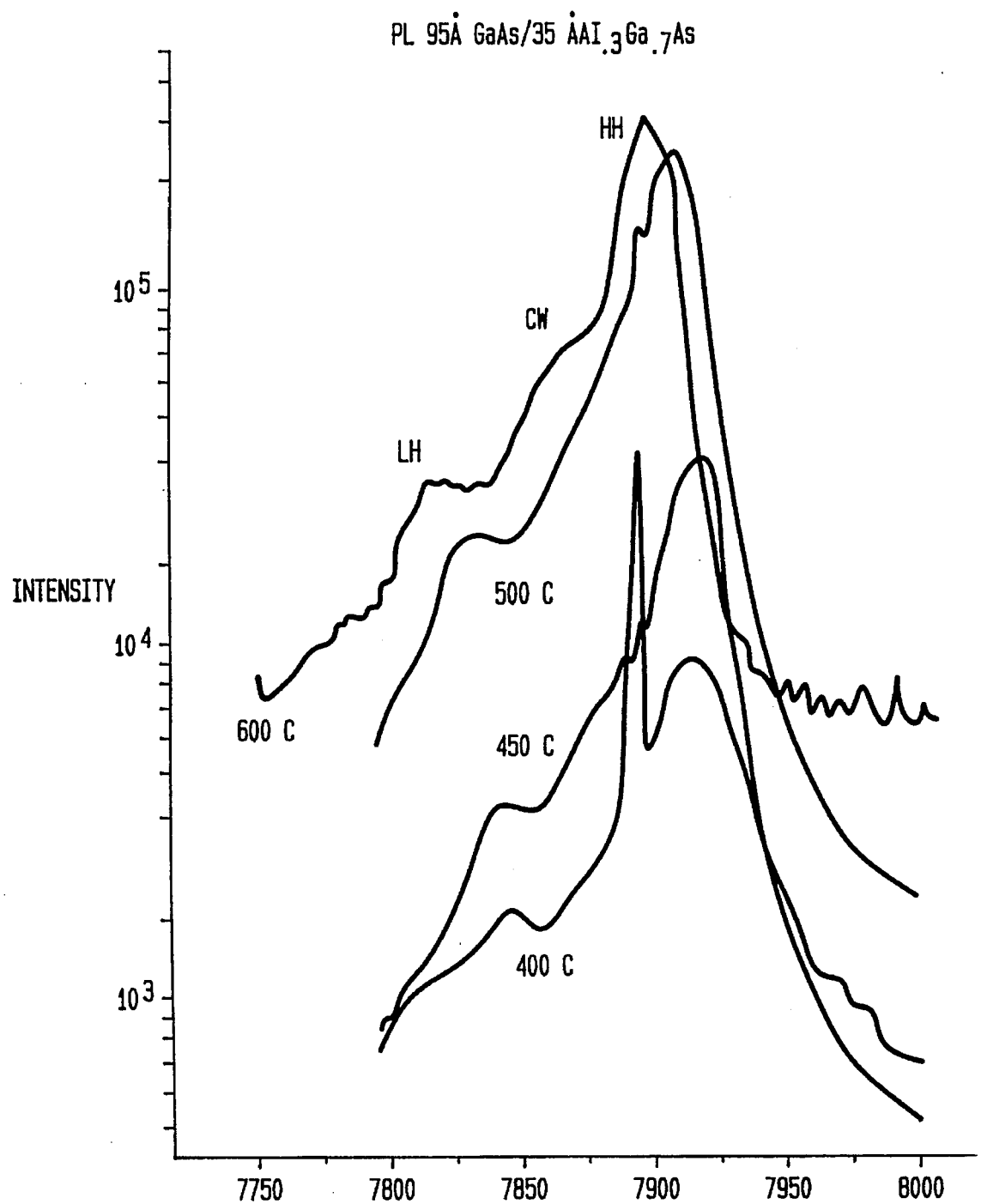
FIG. 3 is a graphical plot of PL intensity (radiative quantum efficiency) versus reciprocal temperature.

To evaluate the temperature dependence of MQW modulators for integration, superlattices consisting of 50 periods of 95 angstroms GaAs QW and 35 angstroms $Al_{0.3}Ga_{0.7}As$ were grown on the surface of a third GaAs sample by gas source MBE at various temperatures. This superlattice structure, when grown at 680° C., exhibits coupled quantum well behavior in which photoexcited carriers extend into neighboring superlattice cells because of a long coherence length. Layers were grown with a V/III ratio of 2:1 at growth rates between 1.0 to 1.4 ML/s. FIG. 3 shows 77° K. PL obtained upon Ar laser excitation of the superlattices grown between 400° C. and 600° C. For growth at 600° C., FIG. 3 shows that superlattice emission consists of light and heavy hole exciton (lh and hh) with a splitting of 11 meV. The FWHM of the heavy transition was 4.3 meV. In addition, the spatially indirect transition (CW), corresponding to electron—hole overlap from adjacent wells, was detected at energies between lh, hh excitons. As growth temperature was lowered, several differences in the spectra became evident. The most distinct difference was the abrupt loss below 500° C. in radiative recombination efficiency. Other differences such as the loss in carrier coherence (CW transition), a blue shift of hh exciton, and increased FWHM of the hh exciton were also evident with reduced growth temperatures.

Figure 4:
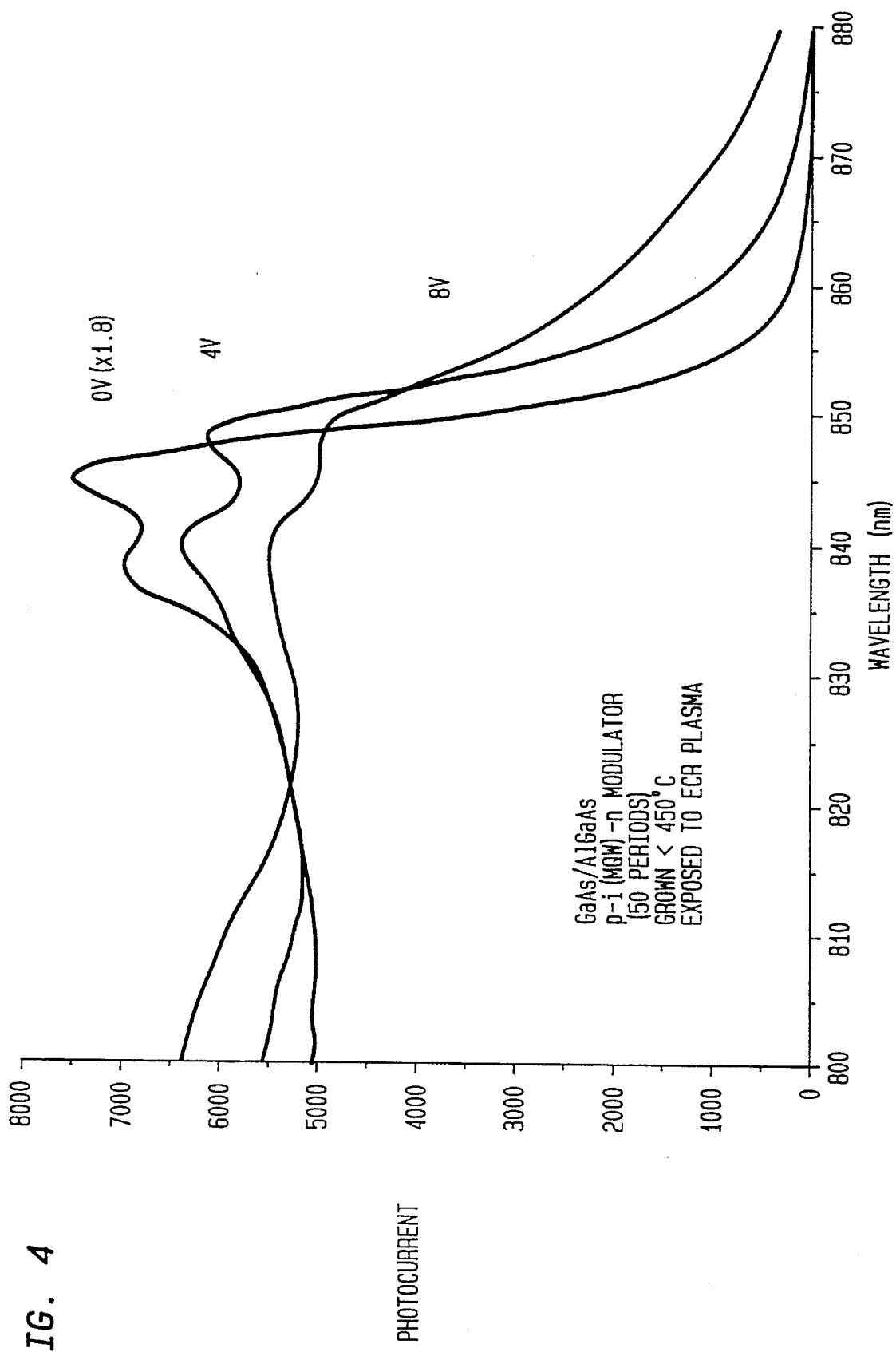
FIG. 4 is a graphical plot of photocurrent versus wavelength for an 850 nm superlattice grown at 430° C. on ECR desorbed GaAs.

To evaluate modulators under the preferred process limitations, a fourth GaAs sample was thermally desorbed under ECR protons at 350° C. to obtain the As-stabilized reconstruction. The previously described superlattice was grown at 430° C. in a pin geometry on an $Al_{0.3}Ga_{0.7}As$ n-type stop etch layer. Diode breakdowns of greater than 30 volts were achieved, comparable to the results achieved with the optimally grown modulators. FIG. 4 shows normalized photocurrent spectra obtained at different bias voltages. A voltage-dependent photocurrent response was detected below 5 volts, presumably because carrier sweep out from the wells was inhibited by non-radiative centers. The normalized spectra show that Quantum Confined Stark Shifts indeed occur at low voltages. Moreover, their quality was sufficiently high for the devices to support systems operating at $\lambda$ (unbiased exciton).

It will be readily appreciated by those skilled in the art that a wide variety of VLSI optoelectronic circuits having monolithically integrated optical and electronic devices thereon may be fabricated in accordance with the present invention. Thus, while there have been shown and described and pointed out fundamental novel features of the invention as applied to illustrative embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A process for fabricating a smart pixel array on a compound semiconductor surface having a preexisting VLSI electronic circuit on the surface, comprising the steps of:

thermally activating the compound semiconductor surface while directing an atomic gas plasma at the compound semiconductor surface for removing substantially all surface contaminants from the compound semiconductor surface to form a substantially impurity free compound semiconductor surface; and growing a plurality of optical devices on said compound semiconductor surface at a temperature below 500° C.

2. The process according to claim 1, wherein said thermally activating step comprises thermally activating the compound semiconductor surface while directing atomic hydrogen plasma at the surface with an electron cyclotron resonance source.

3. The process according to claim 2, wherein the compound semiconductor surface has a temperature that does not exceed 430° C. during said removal step.

4. The process according to claim 3, wherein the compound semiconductor surface has a temperature that does not exceed 430° C. during said growing step.

5. The process according to claim 1, wherein said optical devices are formed by gas source molecular beam epitaxy during said growing step.

6. The process according to claim 1, wherein said substantially impurity free compound semiconductor surface has a highly ordered atomic structure resulting from said thermally activating step.

7. The process according to claim 6, wherein said substantially impurity free compound semiconductor surface provides multiple orders of Laue zones upon electron diffraction.

8. The process of claim 2, wherein said atomic hydrogen plasma is comprised of hydrogen ions.

9. The process of claim 8, wherein said hydrogen ions are accelerated to an energy level of substantially 60 volts before being directed at the compound semiconductor surface.

10. A process for fabricating a smart pixel array on a compound semiconductor surface having a preexisting VLSI electronic circuit on the surface, comprising the steps of:

thermally activating the compound semiconductor surface while directing an atomic hydrogen gas plasma comprised of hydrogen ions at the compound semiconductor surface for removing substantially all surface contaminants from the compound semiconductor surface to form a substantially impurity free Semiconductor surface; and growing a plurality of optical devices on said compound semiconductor surface at a temperature below 430° C.

11. The process of claim 10, wherein an electron cyclotron resonance source is used for said directing of atomic hydrogen plasma at the compound semiconductor surface.

12. The process of claim 10, wherein said optical devices are formed by gas source molecular beam epitaxy during said growing step.

13. The process according to claim 10, wherein said substantially impurity free compound semiconductor surface has a highly ordered atomic structure resulting from said thermally activating step.

14. The process according to claim 13, wherein said substantially impurity free compound semiconductor surface provides multiple orders of Laue zones upon electron diffraction.

15. The process of claim 10, wherein said hydrogen ions are accelerated to an energy level of substantially 60 volts before being directed at the compound semiconductor surface.

\* \* \* \* \*